(12) United States Patent
Yamamoto et al.

(10) Patent No.: US 7,737,705 B2
(45) Date of Patent: Jun. 15, 2010

(54) STATE DETECTING METHOD AND INSULATION RESISTANCE DETECTOR

(75) Inventors: Susumu Yamamoto, Shizuoka (JP); Satoshi Ishikawa, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 108 days.

(21) Appl. No.: 11/633,580

(22) Filed: Dec. 5, 2006

(65) Prior Publication Data

US 2007/0132459 A1   Jun. 14, 2007

(30) Foreign Application Priority Data

Dec. 9, 2005   (JP) ............................ 2005-355691

(51) Int. Cl.
*G01R 31/02* (2006.01)
(52) U.S. Cl. ................... 324/541; 324/503; 324/509; 324/527; 324/551; 324/705
(58) Field of Classification Search .................. 324/541
See application file for complete search history.

(56) References Cited

U.S. PATENT DOCUMENTS

| 7,005,860 B2* | 2/2006 | Yamamoto et al. .......... 324/527 |
| 7,012,435 B2* | 3/2006 | Yamamoto et al. .......... 324/527 |
| 2005/0073317 A1* | 4/2005 | Yamamoto et al. .......... 324/503 |

FOREIGN PATENT DOCUMENTS

| JP | 2005-114496 | 4/2005 |
| JP | 2005-114497 | 4/2005 |

* cited by examiner

*Primary Examiner*—Timothy J Dole
*Assistant Examiner*—Benjamin M Baldridge
(74) *Attorney, Agent, or Firm*—Kratz, Quintos & Hanson, LLP

(57) ABSTRACT

There is provided a state detecting method adopted to an insulation resistance detector including the steps of: calculating a difference between the output of the filter when a pulse signal having a first pulse width is applied to the series circuit, and the output of the filter when a pulse signal having a second pulse width shorter than the first pulse width is applied to the series circuit; and detecting the state of the insulation resistance detector based on the calculated difference.

15 Claims, 5 Drawing Sheets

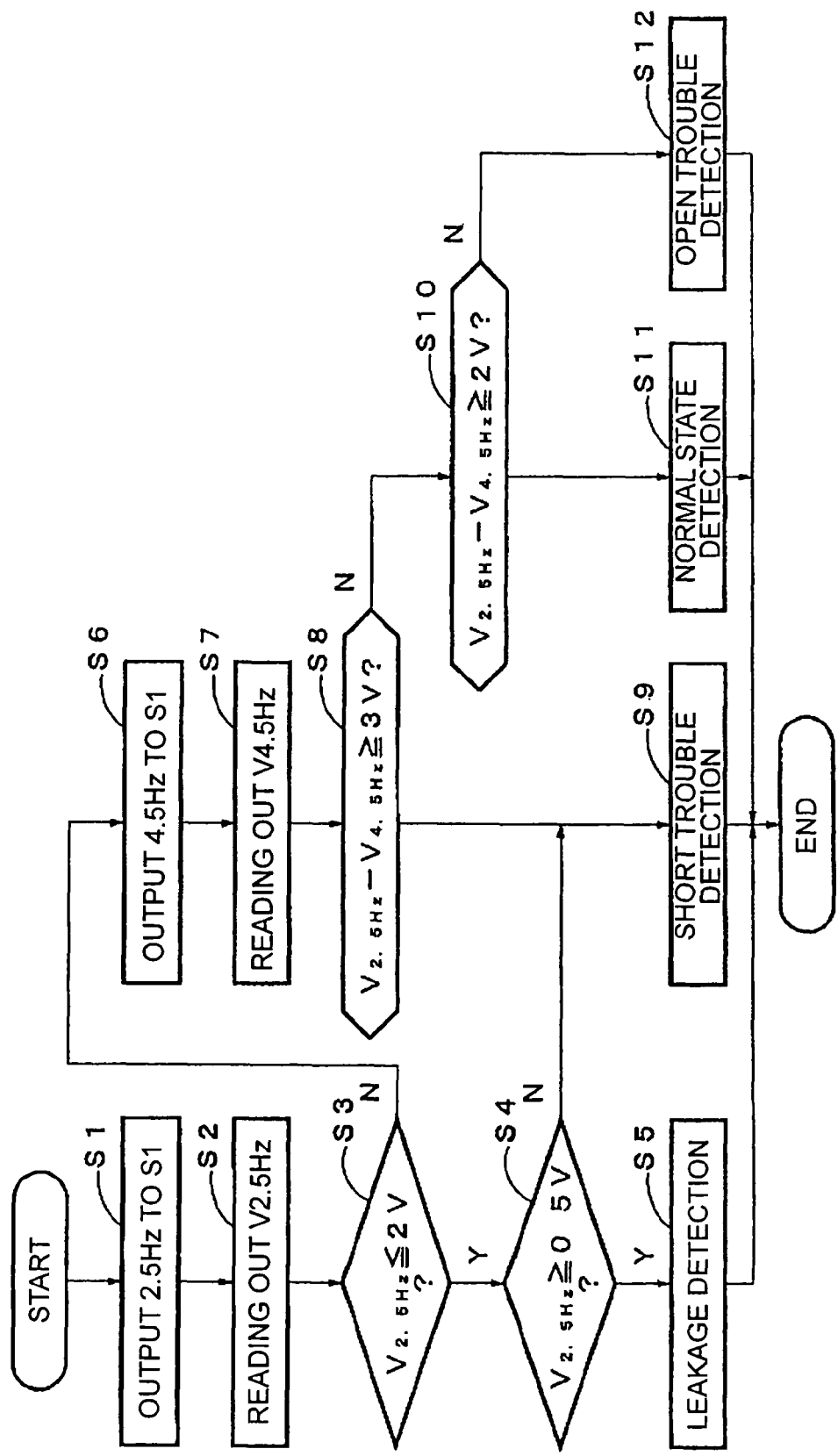

STATE DETECTING METHOD AND INSULATION RESISTANCE DETECTOR

CROSS REFERENCE TO RELATED APPLICATIONS

This application is based on Japanese Patent Application No. 2005-355691, the contents of which are hereby incorporated by reference.

BACKGROUND OF THE INVENTION

1. Field of the Invention

The present invention relates to a state detecting method and an insulation resistance detector, in particular to a state detecting method for detecting a degradation of the insulation resistance between a ground and a direct current power supply, and a detector using the same.

2. Description of the Related Art

Conventionally, an insulation resistance detector using the above described state detecting method is known, for example, Japanese Patent Application Document No. 2005-114496. As shown in FIG. 1, the insulation resistance detector 50 includes a detecting resistor Rd connected in series to an insulating resistor Ri between a battery as the direct current power supply and a vehicle body, and a coupling capacitor mounted in between the insulating resistor Ri and the detecting resistor Rd for cutting off the direct current. The insulation resistance detector 50 further includes a pulse oscillation circuit 51 (pulse signal supplying member) for supplying a rectangular wave pulse signal P1 having a specific peak value with a series circuit consisting of the insulating resistor Ri, the coupling capacitor Co, and the detecting resistor Rd. Here, the peak value means the highest voltage in a pulse signal.

The pulse oscillation circuit 51, for example, includes a constant amplitude pulse generating circuit. When a control circuit 52 inputs a frequency signal S1 for the rectangular pulse signal P1 into the constant amplitude pulse generating circuit, a frequency of the rectangular wave pulse outputted from the constant amplitude pulse generating circuit is changed.

Further, a connection voltage Vx between the coupling capacitor Co-detecting resistor Rd is expressed by a formula (1) in which the peak voltage of the rectangular pulse signal P1 is divided by the detecting resistor Rd and the insulating resistor Ri.

$$Vx = Vp * Ri/(Rd+Ri) \quad (1)$$

Where, Vp is a peak voltage of the rectangular pulse signal P1.

Accordingly, when the insulating resistor Ri is larger than the detecting resistor Rd as normal, the connection voltage Vx is nearly the same peak voltage as the rectangular pulse signal P1. On the other hand, when the insulating resistor Ri is reduced and the insulating resistor Ri is smaller than the detecting resistor Rd, the connection voltage Vx is reduced.

The insulation resistance detector 50 further includes a low pass filter 53 for outputting the connection voltage Vx after eliminating signals more than specific frequency. This low pass filter 53 is composed of a resistor Rf and a capacitor Cf and aimed for eliminating high frequency noises superimposed on the connection voltage Vx. An output of the low pass filter 53 is shaped at the waveform shaping circuit 54, then supplied to a control circuit 52. This control circuit 52 is composed of such as a microcomputer.

Next, a detecting principle of insulation resistance detector will be explained with reference to FIG. 5. In FIG. 5, L1 is a graph of frequency of the rectangular pulse signal P1 versus pulse peak value outputted from the low pass filter 53 indicating a normal state where the insulating resistor Ri is not reduced, and the insulation resistance detector 50 is not malfunctioning.

As shown in FIG. 5, in normal, when the frequency supplied from the pulse oscillation circuit 51 is less than 2.5 Hz, the output peak voltage of the low pass filter 53 is substantially equal to the peak voltage of the rectangular pulse signal P1 outputted from the pulse oscillation circuit 51. When the frequency supplied from the pulse oscillation circuit 51 is more than 2.5 Hz, as the frequency increases, the output peak voltage of the low pass filter 53 decreases.

This is because normally, when a time constant of the low pass filter 53 is large, when the frequency of the rectangular pulse signal P1 increases over the 2.5 Hz, the time between the rising time of the rectangular pulse signal P1 and the time for the output of the low pass filter 53 to reach 5 V as the peak value of the rectangular pulse signal P1 is shorter than the pulse width of the rectangular pulse signal P1. Namely, when the pulse width decreases corresponding to the increase of the frequency, before the output of the low pass filter 53 reaches 5 V as the peak voltage of the rectangular pulse signal P1, the supply of the rectangular pulse signal P1 is cut off, and the peak value is less than 5 V. When supplying the higher frequency of the rectangular pulse signal P1, the rectangular pulse signal P1 having the shorter pulse width is supplied, and the peak value of the low pass filter 53 is further reduced.

L2 in FIG. 5 shows a graph of the frequency of the rectangular pulse signal P1 versus the output peak voltage of the low pass filter 53, when the insulation resistance detector 50 is malfunctioning, for example, coupling capacitor Co or capacitor Cf is open.

As shown in FIG. 5, at the malfunction, even when the frequency increases, namely, when reducing the pulse width, the output peak voltage of the low pass filter 53 is substantially constant. This is because when the coupling capacitor or the capacitor Cf is open, the time constant of the low pass filter 53 decreases, and the rising time of the output of the low pass filter 53 is shorter than the normal state.

According to the above, when the coupling capacitor Co is open, namely, the connection between the insulation resistance detector 50 and the insulating resistor Ri is broken, the output peak voltage of the low pass filter 53 is constantly equal to the peak voltage of the rectangular pulse signal P1. Therefore, even when the insulating resistor Ri is reduced, the output of the low pass filter 53 is not reduced, and the reduction of the insulating resistor Ri cannot be detected.

Further, when the capacitor Cf of the low pass filter 53 is open, the noise elimination at the low pass filter 53 cannot be achieved, and the noise superimposed signal is inputted into the control circuit 52. In this case also, the reduction of the insulating resistor Ri cannot be detected correctly.

L3 in FIG. 5 shows a graph of the frequency of the rectangular pulse signal P1 versus the output peak voltage of the low pass filter 53, when the insulation resistance detector 50 is malfunctioning, for example, coupling capacitor Co or capacitor Cf is short.

As described above, when the coupling capacitor Co or capacitor Cf is short, then even applying the rectangular pulse signal P1, the output of the low pass filter 53 does not rise. Therefore, even when the frequency increases, namely, the pulse width decreases, the output voltage is constantly about 0.2 V.

As described above, when the coupling capacitor Co or capacitor Cf is short, the output of the low pass filter 53 is constantly low. Therefore, even when the insulating resistor Ri is not reduced, the output of the low pass filter 53 is reduced so that the reduction of the insulating resistor Ri cannot be detected.

Therefore, in a conventional detecting method, as shown in FIG. 5, when applying the rectangular pulse signal P1 of 2.5 Hz, and the output peak value of the low pass filter 53 is more than a threshold value X1, and when applying the rectangular pulse signal P1 of 5.5 Hz, and the output peak value of the low pass filter 53 is less than a threshold value X2, the insulation resistance detector 50 is judged as a normal state.

On the other hand, when the rectangular pulse signal P1 of 2.5 Hz and 5.5 Hz are applied, and the outputs of the low pass filter 53 are more than the threshold voltage X1, the insulation resistance detector 50 is judged as an open state.

Further, when the rectangular pulse signal P1 of 2.5 Hz and 5.5 Hz are applied, and the outputs of the low pass filter 53 are less than the threshold voltage X3, the insulation resistance detector 50 is judged as a short state.

Further, in Japanese Patent Application Document 2005-114496, the pulse width of the rectangular pulse signal P1 is changed by changing the frequency of the rectangular pulse signal P1. In Japanese Patent Application Document 2005-114497, a duty ratio of the rectangular pulse signal P1 is changed for changing the pulse width of the rectangular pulse signal P1.

Incidentally, in the insulation resistance detector 50, the output of the low pass filter 53 in response to the same frequency of the rectangular pulse signal P1 is different in each product. This is because a circuit constant of the insulation resistance detector 50, the voltage source, and circuit characteristics of the low pass filter 53 are varied in each product.

Namely, as shown by an alternate long and short dash line in FIG. 6A, there is a product of which output peak voltage of the low pass filter 53 is shifted up in response to the frequency of the rectangular pulse signal P1 against the other product shown in a solid line. As shown by an alternate long and short dash line in FIG. 6B, there is a product of which output peak voltage of the low pass filter 53 is shifted down in response to the frequency of the rectangular pulse signal P1 against the other product shown in a solid line.

However, according to the conventional state detecting method, on an assumption that the output peak voltage of the low pass filter 53 is constant in each product, and by comparing the output of the low pass filter 53 with the threshold voltages X1, X2, X3, normal, open, short states are detected.

Therefore, as shown by the alternate long and short dash line in FIG. 6A, when the output peak voltage of the low pass filter 53 is shifted up, even when the insulation resistance detector 50 is normal, the output peak voltage of the low pass filter 53 may be more than X2 in response to the 5.5 Hz rectangular pulse signal P1. Therefore, even when the insulation resistance detector 50 is normal, the output peak voltage of the low pass filter 53 may be more than X1 in response to 2.5 Hz rectangular pulse signal P1, and the output peak voltage of the low pass filter 53 may be less than X2 in response to 5.5 Hz rectangular pulse signal P1. Thus, the normal state of the insulation resistance detector 50 cannot be detected.

Further, as shown by the alternate long and short dash line in FIG. 6B, when the output peak voltage of the low pass filter 53 is shifted down, even when the insulation resistance detector 50 is open, the output peak voltage of the low pass filter 53 may be less than X1 in response to the 5.5 Hz rectangular pulse signal P1. Therefore, even when the insulation resistance detector 50 is open, the output peak voltage of the low pass filter 53 may be less than X1 in response to 2.5 Hz and 5.5 Hz rectangular pulse signal P1, and the open state of the insulation resistance detector 50 cannot be detected.

It is difficult to correctly detect the state of the insulation resistance detector 50 according to the comparison of the output peak voltage of the low pass filter 53 and the threshold voltages, because there is a shift up or shift down of the output peak voltage of the low pass filter 53. Namely, using the comparison of the output peak voltage of the low pass filter 53 with the threshold voltages X1, X2, X3 cannot correctly detect the state of the insulation resistance detector 50.

Further, according to the above, if the insulation resistance detector 50 is normal in response to the 2.5 Hz rectangular pulse signal P1, and then a short is occurred before the rectangular pulse signal P1 outputs 5.5 Hz pulse, the short state of the insulation resistance detector 50 cannot be detected. Namely, in a rare short that the short is intermittently occurred, a possibility of detecting the short state decreases.

Accordingly, an object of the present invention is to provide a state detecting method to detect a reduction of an insulating resistor correctly and easily, and to provide an insulation resistance detector using the state detecting method.

SUMMARY OF THE INVENTION

In order to attain the object, according to the present invention, there is provided a state detecting method adopted to an insulation resistance detector including:

a detecting resistor connected in series to an insulating resistor interposed between a ground and a direct current power supply;

a coupling capacitor interposed between the insulating resistor and the detecting resistor;

a pulse signal applying member for applying a pulse signal to a series circuit composed of the insulating resistor, the coupling capacitor, and the detecting resistor;

a filter for filtering a specific frequency and outputting a node voltage between the coupling capacitor and the detecting resistor; and a reduction detecting member for detecting a reduction of the insulating resistor based on the output of the filter, said method including the steps of:

calculating a difference between the output of the filter when a pulse signal having a first pulse width is applied to the series circuit, and the output of the filter when a pulse signal having a second pulse width shorter than the first pulse width is applied to the series circuit; and detecting the state of the insulation resistance detector based on the calculated difference.

Preferably, when the calculated difference is more than or equal to a short judging value, the method judges that the insulation resistance detector has a short circuit malfunction.

Preferably, when the filter output at the pulse signal having the first pulse width is over a specific value, and the calculated difference is less than a open judging value which is smaller than the short judging value, the method judges that the insulation resistance detector has an open circuit malfunction.

Preferably, when the calculated difference is less than the short judging value, and more than or equal to a normal judging value which is less than the short judging value, the method judges that the insulation resistance detector is normal.

Preferably, when the calculated difference is more than or equal to the normal judging value, the method judges that the insulation resistance detector is normal.

Preferably, when the filter output at the pulse signal having the first pulse width is over a specific value, and the calculated difference is less than a open judging value which is equal to or smaller than the normal judging value, the method judges that the insulation resistance detector has an open circuit malfunction.

Preferably, when the filter output at the pulse signal having the first pulse width is less than an initial short judging value, the method judges that the insulation resistance detector has an initial short state.

According to another aspect of the present invention, there is provided an insulation resistance detector including:

a detecting resistor connected in series to an insulating resistor interposed between a ground and a direct current power supply;

a coupling capacitor interposed between the insulating resistor and the detecting resistor;

a pulse signal applying member for applying a pulse signal to a series circuit composed of the insulating resistor, the coupling capacitor, and the detecting resistor;

a filter for filtering a specific frequency and outputting a node voltage between the coupling capacitor and the detecting resistor; and a reduction detecting member for detecting a reduction of the insulating resistor based on the output of the filter, said detector further including:

a pulse width varying member to make the pulse signal applying member apply pulse signals having a first pulse width and a second pulse width shorter than the first pulse width;

a differential operation member for calculating a difference between the filter output at the pulse signal having the first pulse width and the filter output at the pulse signal having the second pulse width; and a detecting member for detecting a state of the insulation resistance detector based on the difference calculated by the differential operation member.

These and other objects, features, and advantages of the present invention will become more apparent upon reading of the following detailed description along with the accompanied drawings.

BRIEF DESCRIPTION OF THE DRAWINGS

FIG. 4 is a flow chart showing a fault detection process of a control circuit 52 composing the insulation resistance detector;

DETAILED DESCRIPTION OF THE PREFERRED EMBODIMENTS

A state detecting method and an insulation resistance detector will be explained with reference to figures. The insulation resistance detector includes a detecting resistor Rd connected in series to an insulating resistor Ri between a battery B as the direct current power supply and a vehicle body E, a coupling capacitor Co, a pulse oscillation circuit 51 (pulse signal supplying member), a low pass filter 53, a waveform shaping circuit 54, and a control circuit 52.

Figure 1:
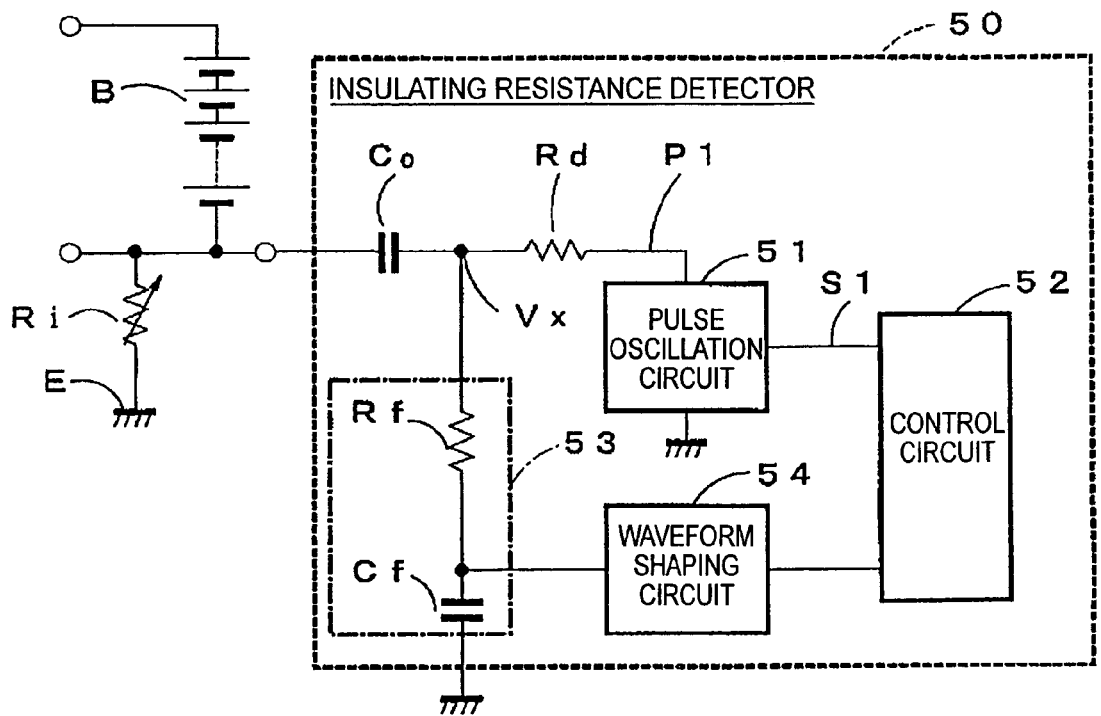
FIG. 1 is a circuit diagram showing an embodiment of an insulation resistance detector implementing a state detecting method according to the present invention.

Next, a principle for the state detecting method of the insulation resistance detector 50 shown in FIG. 1 will be explained with reference to FIG. 2. A curve L1 of FIG. 2 shows a relationship between the frequency of the rectangular pulse signal P1 and a peak voltage outputted from the low pass filter 53 at a normal mode where the insulating resistor Ri is not reduced, and the insulation resistance detector 50 is not malfunctioning.

Figure 2:
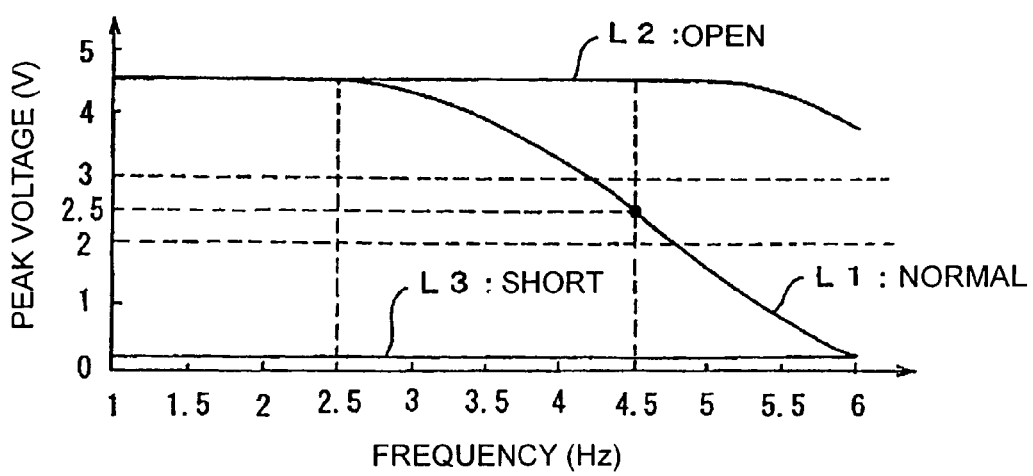
FIG. 2 is a graph showing relations between frequency of a rectangular pulse signal P1 at normal, open, and short states, and output peak voltage of a low pass filter 53.

As shown in FIG. 2, in the normal state, when the frequency supplied from the pulse oscillation circuit 51 is less than 2.5 Hz, the output peak voltage of the low pass filter 53 is substantially equal to that of the rectangular pulse signal P1 outputted from the pulse oscillation circuit 51. On the other hand, as the frequency supplied from the pulse oscillation circuit 51 increases from 2.5 Hz, the output peak voltage of the low pass filter 53 decreases.

This is because in the normal state, the time constant of the low pass filter 53 is large. When the frequency of the rectangular pulse signal P1 increases over 2.5 Hz, the rising time to peak voltage 4.7 V is longer than the pulse width of the rectangular pulse signal P1. Namely, when the pulse width is short according to the increase of the frequency, before the output of the low pass filter 53 reaches the peak voltage 4.7 V, the source of the rectangular pulse signal P1 is cut off, and the peak voltage is less than 4.7 V. As the frequency of the rectangular pulse signal P1 increases, the pulse width decreases and the peak voltage of the low pass filter 53 decreases.

A curve L2 of FIG. 2 shows a relationship between the frequency of the rectangular pulse signal P1 and the output peak voltage of the low pass filter 53 when the insulation resistance detector 50 is malfunctioning, for example, the coupling capacitor Co or the capacitor Cf is open.

As shown in FIG. 2, when the insulation resistance detector 50 is open, the output peak voltage of the low pass filter 53 is constant even when the frequency of the rectangular pulse signal P1 increases. This is because the time constant of the low pass filter 53 is short, and the rising time of the output of the low pass filter 53 in the short state is shorter than that in the normal state.

A curve L3 of FIG. 2 shows a relationship between the frequency of the rectangular pulse signal P1 and the output peak voltage of the low pass filter 53 when the insulation resistance detector 50 is malfunctioning, for example, the coupling capacitor Co or the capacitor Cf is short.

When the capacitor Co or Cf is short, the output of the low pass filter 53 does not rise even when the rectangular pulse signal P1 outputs. Even when the frequency of the rectangular pulse signal P1 increases, the output of the low pass filter 53 is constantly about 0.2 V.

According to the state detecting method of the present invention, when the peak voltage at 2.5 Hz ($V_{2.5\ Hz}$) is in a specific range (more than or equal to 0.5V, and less than or equal to 2V), the method judges that the insulating resistor Ri is reduced, and a short circuit is detected. Further, when the $V_{2.5\ Hz}$ is less than the initial shot judging value 0.5V, the method judges that the insulation resistance detector 50 is in the initial short state. Further, as described above, the specific range is more than the initial short judging range 0.5 V. Therefore, the method judges both the reduction of the insulating resistor Ri, in particular, several meg ohm to several kilo ohm, and the initial short state.

Next, a case when the short circuit is occurred between acquiring $V_{2.5\ Hz}$ and $V_{4.5\ Hz}$ will be explained. As shown in FIG. 2, the insulation resistance detector 50 is normal when acquiring $V_{2.5\,Hz}$ and short when acquiring $V_{4.5\,Hz}$, the peak voltage $V_{2.5\,Hz}$ is about 5 V, and $V_{4.5\,Hz}$ is about 0.2 V. The difference ($V_{2.5\,Hz}-V_{4.5\,Hz}$) is large, and about 4.8 V. Therefore, according to the present invention, when the difference ($V_{2.5\,Hz}-V_{4.5\,Hz}$) is more than the short judging value 3 V, the method judges that the insulation resistance detector 50 is in the short malfunction. Accordingly, the method can detect the short malfunction after acquiring $V_{2.5\,Hz}$ in the normal state.

Next, a case that the insulation resistance detector 50 is normal will be explained. As shown in FIG. 2, when the insulation resistance detector 50 is normal, the peak voltage $V_{2.5\,Hz}$ is about 5 V, and $V_{4.5\,Hz}$ is about 2.5 V. This 2.5 V is less than the short judging value 3 V. Accordingly, when the difference ($V_{2.5\,Hz}-V_{4.5\,Hz}$) is less than 3V, and more than or equal to 2V, the method judges that the insulation resistance detector 50 is in the normal state.

Next, a case that the insulation resistance detector 50 is in the open state will be explained. As shown in FIG. 2, if the insulation resistance detector 50 is in the open mode, the peak voltage $V_{2.5\,Hz}$ and $V_{4.5\,Hz}$ are about 5 V, and the difference ($V_{2.5\,Hz}-V_{4.5\,Hz}$) is almost 0 V. However, when the insulation resistance detector 50 is in the initial short malfunction, the difference ($V_{2.5\,Hz}-V_{4.5\,Hz}$) is also almost 0 V. So, for distinguishing the open malfunction from the initial short malfunction, the method judges that the insulation resistance detector 50 is in the open malfunction when the peak voltage $V_{2.5\,Hz}$ is over a specific value 2 V, and the difference ($V_{2.5\,Hz}-V_{4.5\,Hz}$) is less than open judging value 2 V.

For distinguishing the open malfunction from the initial short malfunction, the specific value 2 V is larger than the initial short judging value 0.5 V. Further, for distinguishing the reduction of the insulating resistor from the open malfunction, the specific value 2 V is the maximum value of the specific range (0.5 V to 2 V). The open judging value 2 V is equal to the normal judging value 2 V. The open judging value 2 V is smaller than the short judging value 3 V.

Incidentally, the pulse width of the rectangular pulse signal P1 at the frequency 2.5 Hz is the first pulse width in claims. The first pulse width is longer than a minimum pulse width for keeping the peak voltage 4.7 V. In detail, the first pulse width is longer than the pulse width when the rectangular pulse signal P1 is applied and the output of the low pass filter 53 reaches the peak voltage 4.7 V of the rectangular pulse signal P1.

The pulse width of the rectangular pulse signal P1 at the frequency 4.5 Hz is the second pulse width in claims. The second pulse width is shorter than a minimum pulse width for keeping the peak voltage 4.7 V. In detail, the second pulse width is shorter than the pulse width when the rectangular pulse signal P1 is applied and the output of the low pass filter 53 reaches the peak voltage 4.7 V of the rectangular pulse signal P1. As shown in FIG. 2, when the insulation resistance detector 50 is normal, the output peak voltage of the low pass filter 53 is 2.5 V at the frequency 4.5 Hz.

Figure 3A:
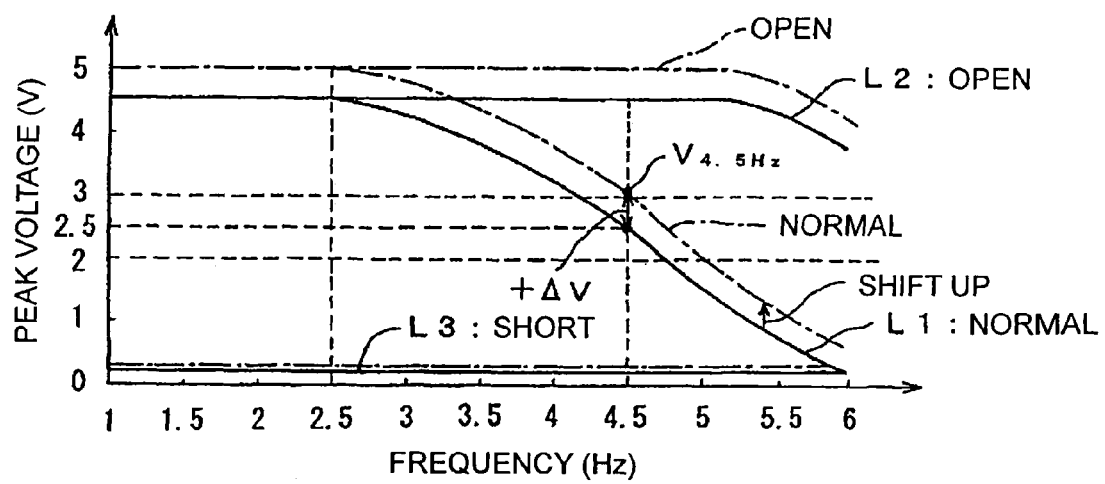
FIGS. 3A and 3B are graphs for explaining the state detecting method according to the present invention.
Figure 3B:
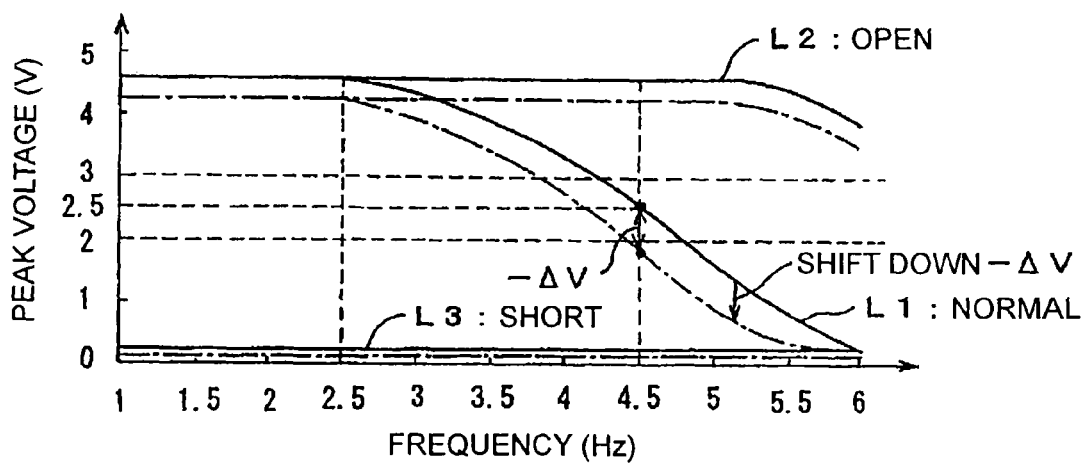
Figure 5:
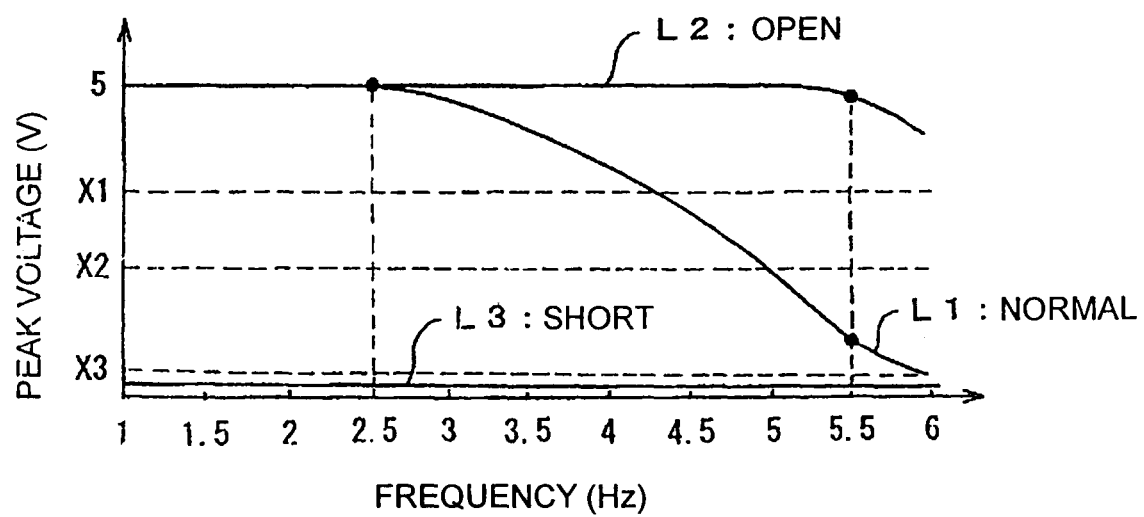
FIG. 5 is a graph for explaining a conventional state detecting method.
Figure 6A:
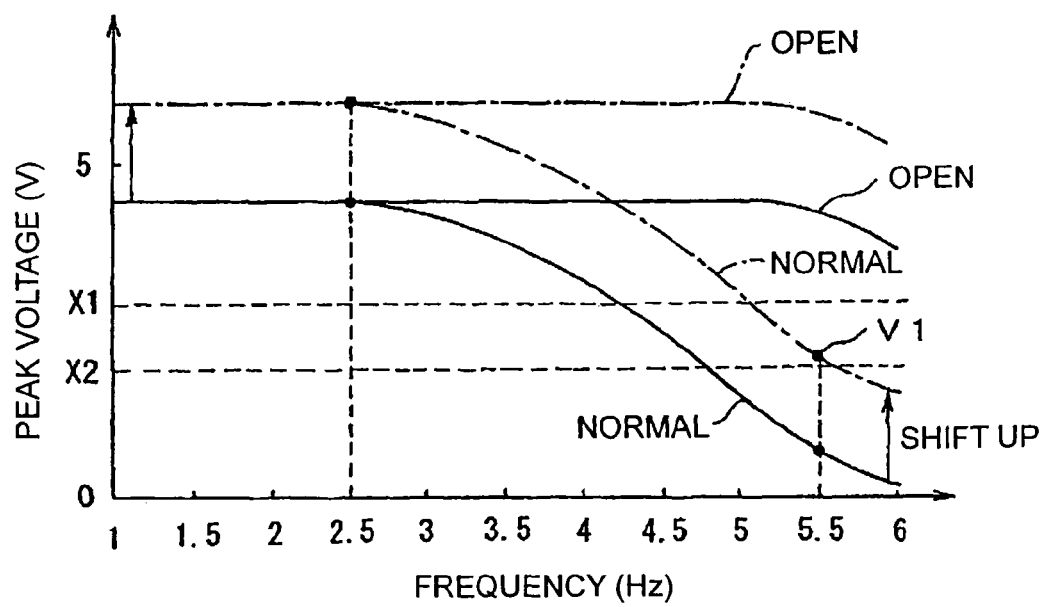
FIGS. 6A and 6B are graphs for explaining a problem of the conventional state detecting method.
Figure 6B:
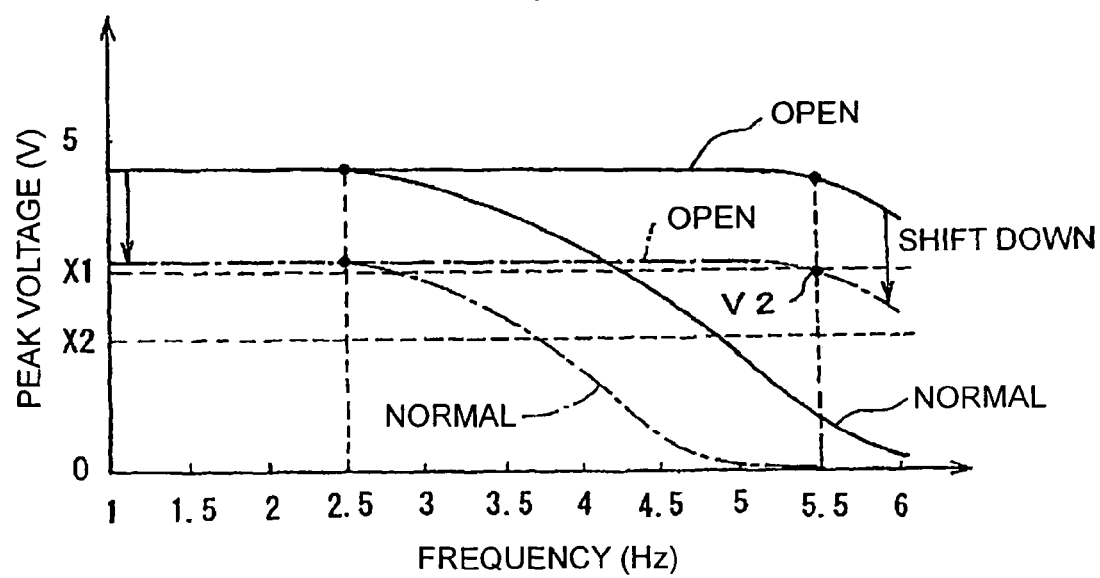

An effect of the insulation resistance detector 50 will be explained. As shown by an alternate long and short dash line in FIGS. 3A and 3B, the output peak voltage of the low pass filter 53 is shifted down or shifted up in a range $\pm\Delta V$ relative to a standard product as shown by a solid line. Therefore, in the conventional comparison of the output peak voltage of the low pass filter 53 and the threshold voltage, owing to the variation of the output peak voltage of the low pass filter 53, the open or the short cannot correctly detected. Namely, according to the conventional method which judges the insulation resistance detector 50 is normal when the peak voltage $V_{4.5\,Hz}$ is less than or equal to 3 V and more than or equal to 2 V, as shown in FIG. 3A, when the output peak voltage of the low pass filter 53 is shifted up, the peak voltage $V_{4.5\,Hz}$ is more than 3 V even when the insulation resistance detector 50 is normal, and the method cannot detect the normality of the insulation resistance detector 50. As shown in FIG. 3B, when the output peak voltage of the low pass filter 53 is shifted down, the peak voltage $V_{4.5\,Hz}$ is less than 2 V even when the insulation resistance detector 50 is normal, and the method cannot detect the normality of the insulation resistance detector 50.

However, the difference ($V_{2.5\,Hz}-V_{4.5\,Hz}$) of the low pass filter 53 cancel the variety of the output peak voltage of the low pass filter 53. Namely, the difference ($V_{2.5\,Hz}-V_{4.5\,Hz}$) is not varied even when the output peak voltage of the low pass filter 53 is varied. Namely, there is no variation among the products.

Accordingly, the method calculates the difference ($V_{2.5\,Hz}-V_{4.5\,Hz}$), and judges normal, short malfunction, open malfunction based on the difference ($V_{2.5\,Hz}-V_{4.5\,Hz}$). Therefore, the method can correctly detect the state of the insulation resistance detector 50.

An operation of the insulation resistance detector 50 will be explained with reference to a flow chart of the control circuit shown in FIG. 4. The control circuit 52 starts the operation with a specific trigger such as ignition switch on. First, the control circuit 52 works as a reduction detecting member, and outputs a signal S1 at the frequency 2.5 Hz (step S1). Then, the pulse oscillation circuit 51 outputs the rectangular pulse signal P1 at the frequency 2.5 Hz. The control circuit 52 reads the output peak voltage $V_{2.5\,Hz}$ outputted from the waveform shaping circuit 54 and stores the output peak voltage $V_{2.5\,Hz}$ in a memory member (step S2).

Next, when the peak voltage $V_{2.5\,Hz}$ is lower than or equal to the specific voltage 2 V and larger than or equal to the initial short judging value 0.5 V ("Y" in step S3 and "Y" in step S4), the control circuit 52 judges that the insulating resistor Ri is reduced and the insulation resistance detector 50 is short-circuited (step S5) and the process ends. On the other hand, when the peak voltage $V_{2.5\,Hz}$ is less than 0.5 V ("N" in step S4), the control circuit 52 detects the short state of the insulation resistance detector 50 (step S9), and the process ends.

When the peak voltage $V_{2.5\,Hz}$ is more than or equal to 2 V ("N" in step S3), the control circuit 52 outputs a frequency signal S1 4.5 Hz (step S6). In response to this signal, the pulse oscillation circuit 51 outputs the rectangular pulse signal P1 of 4.5 Hz. Namely, the control circuit 52 works as a pulse width changing member. Of course, the second pulse width is shorted than the first pulse width. Then, the control circuit 52 reads out the output peak voltage $V_{4.5\,Hz}$ outputted from the waveform shaping circuit 54, and stores the output peak voltage $V_{4.5\,Hz}$ in the memory member (step S7).

Then, the control circuit 52 calculates the difference ($V_{2.5\,Hz}-V_{4.5\,Hz}$). When the difference ($V_{2.5\,Hz}-V_{4.5\,Hz}$) is more than or equal to the short judging value 3 V ("Y" in step S8), the control circuit 52 detects the short malfunction (step S9) and the process ends. On the other hand, when the difference ($V_{2.5\,Hz}-V_{4.5\,Hz}$) is less than the short judging value 3 V, and more than or equal to the normal judging value 2 V, ("N" in step S8 and "Y" in step S10), the control circuit 52 detects that the insulation resistance detector 50 is normal (step S11) and the process ends.

When the difference ($V_{2.5\,Hz}-V_{4.5\,Hz}$) is less than the open judging value 2 V ("N" in step S10), the control circuit 52 detects the insulation resistance detector 50 is in the open malfunction (step S12), and the process ends. According to the above, the control circuit 52 works as the differential operation member, and the detecting member.

According to the above, the control circuit 52 is composed of the microcomputer. However, the control circuit 52 may be composed of a comparator or the like.

According to the above, the first pulse width is a pulse width of the frequency 2.5 Hz. However, this invention is not limited to this. The first pulse width may be a pulse width more than the time from when the rectangular pulse signal P1 applies to when the output of the low pass filter 53 reaches the peak voltage 4.7 V of the rectangular pulse signal P1.

Further, the second pulse width is a pulse width of the frequency 4.5 Hz. However, this invention is not limited to this. The second pulse width may be a pulse width less than the time from when the rectangular pulse signal P1 applies to when the output of the low pass filter 53 reaches the peak voltage 4.7 V of the rectangular pulse signal P1.

According to the above, the pulse width of the rectangular pulse signal P1 is changed by changing the frequency of the rectangular pulse signal P1. However, the pulse width of the rectangular pulse signal P1 may be changed by changing a duty ratio of the rectangular pulse signal P1.

According to the above, when the difference ($V_{2.5\ Hz} - V_{4.5\ Hz}$) is more than or equal to the short judging value 3 V, the control circuit 52 detects the short malfunction. When the difference ($V_{2.5\ Hz} - V_{4.5\ Hz}$) is less than the short judging value 3 V and more than or equal to the normal judging value 2 V, the control circuit 52 detects the normal state. However, the present invention is not limited to this. For example, if it is unnecessary to detect the short malfunction after the $V_{2.5\ Hz}$ is measured, the short judging value 3 V is not used, and only when the difference ($V_{2.5\ Hz} - V_{4.5\ Hz}$) is more than or equal to the normal judging value 2 V, the control circuit 52 may detect the normal state.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The threshold voltages may be changed in the scope of the invention.

What is claimed is:

1. A state detecting method adapted to an insulation resistance detector comprising:
   a detecting resistor connected in series to an insulating resistor interposed between a ground and a direct current power supply;
   a coupling capacitor interposed between the insulating resistor and the detecting resistor;
   a pulse signal applying member for applying a first pulse signal at frequency 2.5 Hz and a second pulse signal at 4.5 Hz to a series circuit composed of the insulating resistor, the coupling capacitor, and the detecting resistor;
   a filter for filtering a specific frequency and outputting a node voltage between the coupling capacitor and the detecting resistor; and
   a reduction detecting member for detecting a reduction of the insulating resistor based on the output of the filter,
   said method comprising the steps of:
   calculating a difference between the output of the filter when the first pulse signal having a first pulse width is applied to the series circuit, and the output of the filter when the second pulse signal having a second pulse width shorter than the first pulse width is applied to the series circuit; and
   detecting the state of the insulation resistance detector based on the calculated difference.

2. The method as claimed in claim 1,
wherein when the calculated difference is greater than or equal to a short judging value, the method judges that the insulation resistance detector has a short circuit malfunction.

3. The method as claimed in claim 2,
wherein when the filter output resulting from the first pulse signal having the first pulse width is greater than a specific value, and the calculated difference is less than a open judging value that is less than the short judging value, the method judges that the insulation resistance detector has an open circuit malfunction.

4. The method as claimed in claim 2,
wherein when the calculated difference is less than the short judging value, and greater than or equal to a normal judging value that is less than the short judging value, the method judges that the insulation resistance detector is normal.

5. The method as claimed in claim 4,
wherein when the filter output resulting from the first pulse signal having the first pulse width is greater than a specific value, and the calculated difference is less than a open judging value that is equal to or smaller than the normal judging value, the method judges that the insulation resistance detector has an open circuit malfunction.

6. The method as claimed in claim 2,
wherein when the filter output resulting from the first pulse signal having the first pulse width is less than an initial short judging value, the method judges that the insulation resistance detector has an initial short state.

7. The method as claimed in claim 1,
wherein when the calculated difference is greater than or equal to the normal judging value, the method judges that the insulation resistance detector is normal.

8. An insulation resistance detector comprising:
   a detecting resistor connected in series to an insulating resistor interposed between a ground and a direct current power supply;
   a coupling capacitor interposed between the insulating resistor and the detecting resistor;
   a pulse signal applying member for applying a first pulse signal at frequency 2.5 Hz and a second pulse signal at 4.5 Hz to a series circuit composed of the insulating resistor, the coupling capacitor, and the detecting resistor;
   a filter for filtering a specific frequency and outputting a node voltage between the coupling capacitor and the detecting resistor; and
   a reduction detecting member for detecting a reduction of the insulating resistor based on the output of the filter,
   said detector further comprising:
   a pulse width varying member to make the pulse signal applying member apply the first pulse signal having a first pulse width and the second pulse signal having a second pulse width that is shorter than the first pulse width;
   a differential operation member for calculating a difference between the filter output at resulting from the first pulse signal having the first pulse width and the filter output resulting from the second pulse signal having the second pulse width; and
   a detecting member for detecting a state of the insulation resistance detector based on the difference calculated by the differential operation member.

9. A malfunction detecting method, comprising:
- outputting a first signal at a first frequency, wherein said outputting of the first signal is performed by a control circuit;
- outputting a second signal at the first frequency, said second signal being output in response to said outputting of the first signal, wherein said outputting of the second signal is performed by a pulse oscillation circuit;
- outputting a third signal, said third signal being output in response to said outputting of the second signal, wherein said outputting of the third signal is performed by a waveform shaping circuit;
- reading an output peak voltage of the third signal;
- storing the output peak voltage of the third signal in a memory member;
- when the output peak voltage of the third signal is not greater than a first predetermined voltage and is not less than a second predetermined voltage, detecting a malfunction;
- when the output peak voltage of the third signal is less than the second predetermined voltage, detecting a malfunction;
- when the output peak voltage of the third signal is not less than the first predetermined voltage,
  - outputting a fourth signal at a second frequency, wherein said outputting of the fourth signal is performed by the control circuit;
  - outputting a fifth signal at the second frequency, said fifth signal being output in response to said outputting of the fourth signal, wherein said outputting of the fifth signal is performed by the pulse oscillation circuit;
  - outputting a sixth signal, said sixth signal being output in response to said outputting of the fifth signal, wherein said outputting of the sixth signal is performed by a waveform shaping circuit;
  - reading an output peak voltage of the sixth signal,
  - storing the output peak voltage of the sixth signal in the memory member, and
  - calculating a difference between the output peak voltage of the third signal and the output peak voltage of the sixth signal;
  - when the calculated difference is not less than a third predetermined voltage, detecting a malfunction;
  - when the calculated difference is less than the third predetermined voltage and is not less than the first predetermined voltage, not detecting a malfunction; and
  - when the calculated difference is less than the first predetermined voltage, detecting a malfunction.

10. The method of claim 9, wherein
- said reading of the peak voltage of the third and sixth signals is performed by the control circuit, and
- said storing of the peak voltage of the third and sixth signals is performed by the control circuit.

11. The method of claim 10, wherein the first frequency is 2.5 Hz, the first predetermined voltage is 2V, the second predetermined voltage is 0.5V, the second frequency is 4.5 Hz, and the third predetermined voltage is 3V.

12. A state detecting method adapted to an insulation resistance detector comprising:
- a detecting resistor connected in series to an insulating resistor interposed between a ground and a direct current power supply;
- a coupling capacitor interposed between the insulating resistor and the detecting resistor;
- a pulse signal applying member for applying a pulse signal to a series circuit composed of the insulating resistor, the coupling capacitor, and the detecting resistor;
- a filter for filtering a specific frequency and outputting a node voltage between the coupling capacitor and the detecting resistor; and
- a reduction detecting member for detecting a reduction of the insulating resistor based on the output of the filter, said method comprising the steps of:
- calculating a difference between the output of the filter when a first pulse signal having a first pulse width is applied to the series circuit, and the output of the filter when a second pulse signal having a second pulse width shorter than the first pulse width is applied to the series circuit; and
- detecting the state of the insulation resistance detector based on the calculated difference,
- wherein the first pulse has a pulse width greater than the time from when the first pulse signal is applied to when the output of the filter reaches a first predetermined peak voltage of the first pulse signal.

13. The method of claim 12, wherein the first predetermined peak voltage is 4.7V.

14. The method of claim 12, wherein the second pulse has a pulse width greater than the time from when the second pulse signal is applied to when the output of the filter reaches a second predetermined peak voltage of the second pulse signal.

15. The method of claim 14, wherein the second predetermined peak voltage is 4.7V.

* * * * *